(12) United States Patent
Matsuhashi

(10) Patent No.: US 12,408,276 B2
(45) Date of Patent: Sep. 2, 2025

(54) WIRING SUBSTRATE

(71) Applicant: Niterra Co., Ltd., Nagoya (JP)

(72) Inventor: Kensuke Matsuhashi, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 133 days.

(21) Appl. No.: 18/264,704

(22) PCT Filed: Apr. 8, 2022

(86) PCT No.: PCT/JP2022/017319
§ 371 (c)(1),
(2) Date: Aug. 8, 2023

(87) PCT Pub. No.: WO2022/224841
PCT Pub. Date: Oct. 27, 2022

(65) Prior Publication Data
US 2024/0114629 A1   Apr. 4, 2024

(30) Foreign Application Priority Data

Apr. 20, 2021  (JP) .................................. 2021-071065

(51) Int. Cl.
*H05K 1/02* (2006.01)
*H05K 3/28* (2006.01)
*H05K 3/46* (2006.01)

(52) U.S. Cl.
CPC ............. *H05K 3/28* (2013.01); *H05K 1/0298* (2013.01); *H05K 3/4673* (2013.01)

(58) Field of Classification Search
CPC ............... H05K 1/0298; H05K 1/0306; H05K 2201/098; H05K 2201/099; H05K 2201/091; H05K 2201/09036; H05K 2201/09063; H05K 3/28; H05K 3/4673; H05K 3/242; H05K 3/423; H05K 3/424;
(Continued)

(56) References Cited

U.S. PATENT DOCUMENTS

| | | | |
|---|---|---|---|
| 2008/0185177 A1* | 8/2008 | Chou .................... | H05K 3/242 29/850 |
| 2015/0114689 A1* | 4/2015 | Ishihara ............... | H05K 3/4691 156/247 |
| 2019/0267313 A1* | 8/2019 | Suzuki .................. | H05K 3/282 |

FOREIGN PATENT DOCUMENTS

| JP | S63-224392 A | 9/1988 |
|---|---|---|
| JP | H09-022958 A | 1/1997 |

(Continued)

OTHER PUBLICATIONS

Japan Patent Office, International Search Report issued in corresponding Application No. PCT/JP2022/017319, mailed Jun. 21, 2022.

*Primary Examiner* — Roshn K Varghese
(74) *Attorney, Agent, or Firm* — Stites & Harbison, PLLC; Jeffrey A. Haeberlin; James R. Hayne

(57) ABSTRACT

A wiring substrate (1) includes an insulating substrate (11), a surface metal layer provided on a surface of the insulating substrate (11), and a wiring layer disposed in an inner part of the insulating substrate (11). The surface metal layer (for example, a lead wiring portion (52)) is divided by a groove (61). The wiring layer (for example, an internal wiring trace (32)) is disposed in such a manner that, as viewed from above, the wiring layer detours around a region where the groove (61) is formed so as not to overlap with the region where the groove (61) is formed.

3 Claims, 12 Drawing Sheets

(58) Field of Classification Search
CPC ............... H05K 3/4629; H05K 3/4691; H05K 2203/107; H05K 2203/175; H05K 2203/0723; H05K 2203/0703; Y10T 29/49121
See application file for complete search history.

(56) References Cited

FOREIGN PATENT DOCUMENTS

| | | |
|---|---|---|
| JP | 2008-091560 A | 4/2008 |
| JP | 2017-032290 A | 2/2017 |

* cited by examiner

WIRING SUBSTRATE

TECHNICAL FIELD

The present disclosure relates to a wiring substrate in which a groove or an insulating coat layer which can serve as a mark for cutting is formed on a surface metal layer.

BACKGROUND ART

In a wiring substrate on which an electronic component such as a semiconductor element is mounted, a metal layer formed of an electrically conductive material such as metal is provided on a surface of an insulating substrate formed of a ceramic material or the like. This metal layer is utilized as terminals for connection with external electronic components.

A plating layer for protecting the metal layer is formed on the surface of the metal layer. The plating layer is formed by means of electrolytic plating. Electrolytic plating is performed by supplying electricity to a wiring trace for plating which is electrically connected to the metal layer. In some cases, after formation of the plating layer on the surface of the metal layer in this manner, a portion between the metal layer and the wiring trace for plating must be cut so as to electrically isolate the metal layer from the wiring trace for plating.

For example, Patent Literature 1 describes a technique of grinding and removing a part of a metalized layer by using a grinding apparatus such as Leutor, thereby electrically isolating a metalized wiring layer and a metalized metal layer. Also, Patent Literature 2 describes a technique of cutting a lead wiring trace, serving as a wiring trace for plating, by applying a light beam such as an ion beam, a laser beam, or an electron beam.

CITATION LIST

Patent Literatures

Patent Literature 1: JPH09-022958A
Patent Literature 2: JP2017-032290A

SUMMARY OF INVENTION

Technical Problem

In the case where, as described above, a portion between the metal layer and the wiring trace for plating is cut so as to electrically isolate the metal layer from the wiring trace for plating, for example, if the intensity of the light beam applied to the surface of the substrate is excessively high, the light beam may reach an inner part of the substrate, thereby forming a deep groove in the substrate. If a wiring layer or the like formed in the inner part of the substrate overlaps with the region where the groove is formed, a groove is also formed in the wiring layer of the inner part. If the wiring layer is cut in this manner, a conduction failure of the wiring layer occurs. Also, if a groove is formed in the metal layer formed in the inner part of the substrate, a portion of the metal layer is exposed to the surface, so that the metal layer becomes more likely to be shorted.

In view of the above, in one aspect of the present disclosure, an object is to provide a wiring substrate which can reduce the possibility of cutting a metal layer, such as a wiring layer, formed in an inner part of a substrate.

Solution to Problem

A wiring substrate according to one aspect of the present disclosure comprises an insulating substrate, a surface metal layer provided on a surface of the insulating substrate and divided by a groove formed on the insulating substrate, and a wiring layer disposed in an inner part of the insulating substrate. In this wiring substrate, the wiring layer is disposed in such a manner that, as viewed from above, the wiring layer detours around a region where the groove is formed so as not to overlap with the region where the groove is formed.

The above-described configuration can reduce the possibility that the wiring layer formed in an inner part of the insulating substrate is cut in a groove forming step performed for forming the groove which divides the surface metal layer.

In the above-described wiring substrate according to the one aspect of the present disclosure, an insulating coat layer may be provided around the groove.

The above-described configuration enables utilization of the insulating coat layer as a mark for forming the groove.

In the above-described wiring substrate according to the one aspect of the present disclosure, the wiring layer may be disposed in such a manner that, as viewed from above, the wiring layer detours around a region where the insulating coat layer is formed so as not to overlap with the region where the insulating coat layer is formed.

In the above-described configuration, since the wiring layer is provided in such a manner that, as viewed from above, the wiring layer does not overlap with the region where the insulating coat layer serving as a mark for forming the groove is formed, it is possible to further reduce the possibility that the wiring layer formed in the inner part of the insulating substrate is cut in the groove forming step.

In the above-described wiring substrate according to the one aspect of the present disclosure, an internal metal layer may be further provided in an inner part of the insulating substrate, wherein the internal metal layer has an opening formed in a region which overlaps with the region where the groove is formed as viewed from above in such a manner that the opening contains the entirety of the region where the groove is formed.

The above-described configuration can reduce the possibility that a groove is formed in the internal metal layer, formed in an inner part of the insulating substrate, in the groove forming step performed for forming the groove which divides the surface metal layer. As a result, it is possible to prevent exposure of a portion of the internal metal layer to the surface, thereby reducing the possibility that the internal metal layer is shorted.

In the above-described wiring substrate according to the one aspect of the present disclosure, the wiring layer may be provided at a position located 0.5 mm or less from the surface of the insulating substrate.

By virtue of the above-described configuration, it is possible to dispose the wiring layer, while detouring around the region where the insulating coat layer is formed, at a position located 0.5 mm or less from the surface of the insulating substrate that can be reached by the energy of a laser beam applied to the surface metal layer. Therefore, the possibility that the wiring layer is cut by the laser beam can be avoided.

In the above-described wiring substrate according to the one aspect of the present disclosure, the internal metal layer may be provided at a position located 0.5 mm or less from the surface of the insulating substrate.

By virtue of the above-described configuration, it is possible to avoid disposition of the internal metal layer in a region which overlaps with the region where the insulating coat layer is formed, as viewed from above, at a position located 0.5 rum or less from the surface of the insulating substrate that can be reached by the energy of a laser beam applied to the surface metal layer. Therefore, the possibility that a groove is formed in the internal metal layer can be avoided.

Advantageous Effect of Invention

The wiring substrate according to the one aspect of the present disclosure can reduce the possibility that a metal layer, such as a wiring laver, formed in an inner part of the substrate is cut.

DESCRIPTION OF EMBODIMENTS

Figure 1:
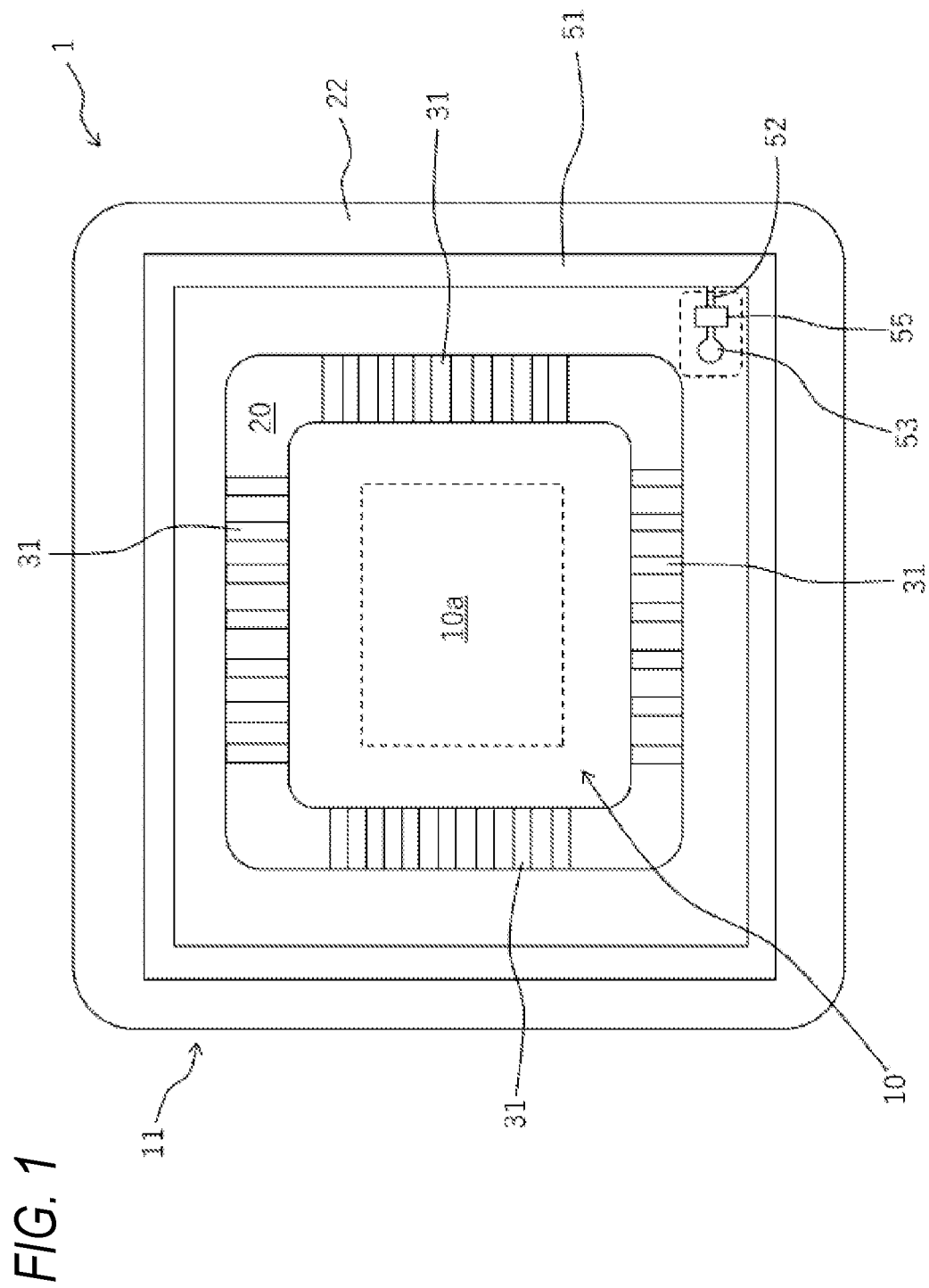
FIG. 1 Schematic plan view showing the structure of a wiring substrate according to one embodiment, FIG. 2 Schematic plan view showing the structure of a semiconductor package in which a semiconductor element is mounted on the wiring substrate shown in FIG. 1.

Embodiments of the present invention will now be described with reference to the drawings. In the following description, identical components are denoted by the same reference numerals. Their names and functions are the same. Therefore, their detailed descriptions will not be repeated.

First Embodiment

In the present embodiment, a wiring substrate 1 will be described as one example of the wiring substrate according to the present invention. A semiconductor chip 71 is mounted on this wiring substrate 1, whereby a semiconductor package 70 is constituted.

FIG. 1 schematically shows a planar structure of the wiring substrate 1. The wiring substrate 1 has an approximately quadrangular shape when viewed from above. The outer shape of the wiring substrate 1 is formed by a ceramic substrate (insulating substrate) 11 including a plurality of ceramic layers. A recess 10 having an approximately quadrangular shape when viewed from above is formed in a central portion of an upper surface of the ceramic substrate 11. A bottom surface of the recess 10 has an element mounting portion 10a on which a semiconductor element such as the semiconductor chip 71 is mounted.

Figure 2:
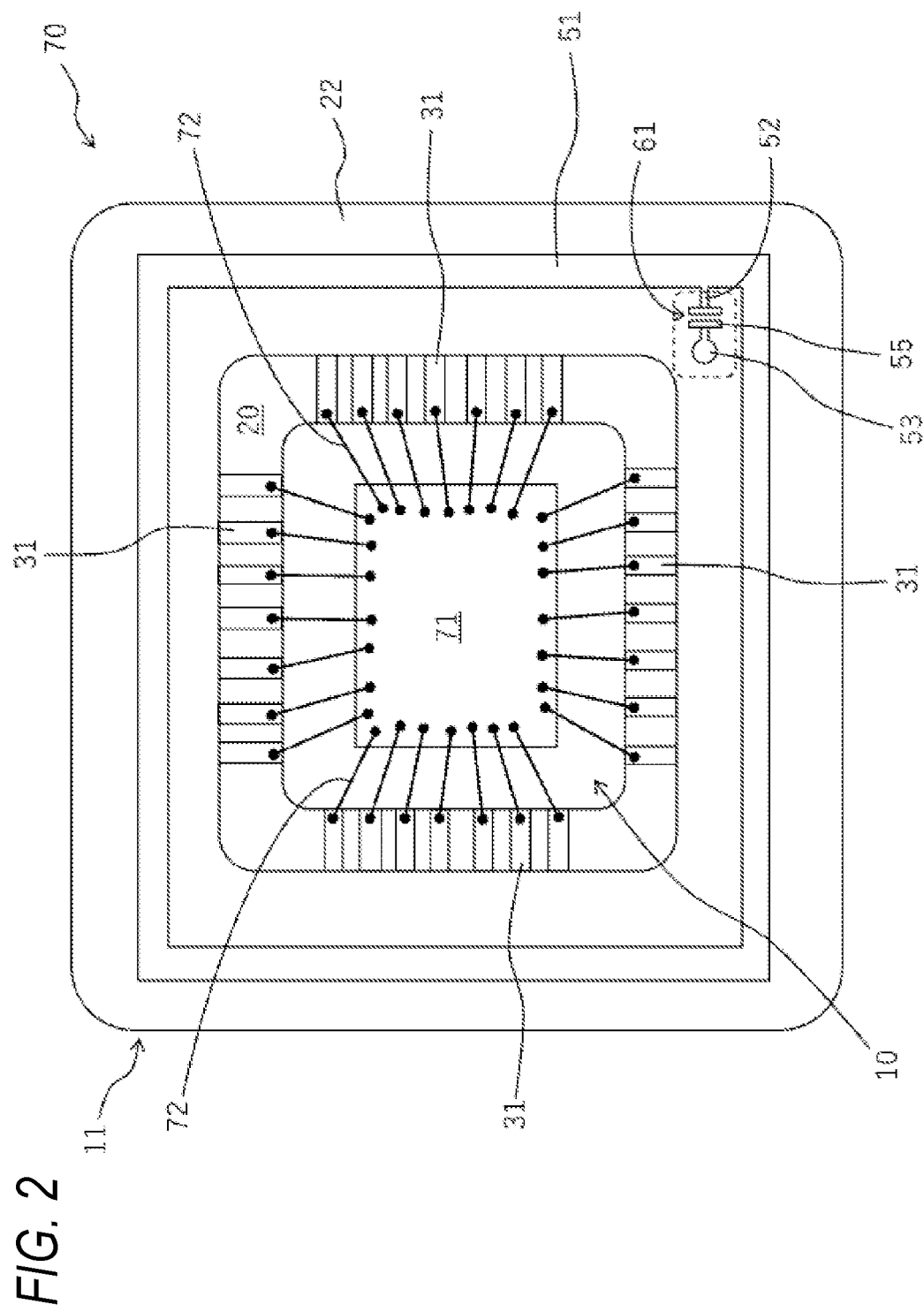

The semiconductor chip 71 is mounted on the element mounting portion 10a of the wiring substrate 1 having the above-described structure. As a result, the semiconductor package 70 is obtained. FIG. 2 schematically shows the structure of the semiconductor package 70.

The wiring substrate 1 is electrically connected to the semiconductor chip 71 through bonding wires 72. Specifically, respective wiring traces 31 of the wiring substrate 1 are electrically connected to respective connection terminals (not shown) of the semiconductor chip 71 by the bonding wires 72. As a result, it becomes possible to transmit electrical signals between the wiring traces 31 and the semiconductor chip 71. The wiring traces 31 are formed on the upper surface of a base ceramic layer 20.

Also, an upper surface metal layer 51 is formed on an upper surface of a side wall of the ceramic substrate 11 formed to surround the recess 10. In the present embodiment, the upper surface metal layer 51 is formed on a surface of a second ceramic layer 22 located at the uppermost position. The upper surface metal layer 51 is used as a wiring trace for plating at the time of electrolytic plating. The upper surface metal layer 51 has a frame-shaped conductor trace formed to surround the recess 10. At the time of electrolytic plating, electric power applied to a terminal portion 53 is transmitted to each metal layer via the upper surface metal layer 51.

The upper surface metal layer 51 has a lead wiring portion 52. The lead wiring portion 52 is provided to branch off the upper surface metal layer 51 at a predetermined position. The position of the lead wiring portion 52 can be arbitrarily determined in accordance with the shapes of various conductor traces (wirings, terminals, vias, etc.) formed on the wiring substrate 1.

A terminal portion 53 is provided at a distal end of the lead wiring portion 52. This terminal portion 53 is used as a connection terminal to which electric power is applied at the time of electrolytic plating. Also, this terminal portion 53 is used as a terminal for inspection at the time of electrical inspection of the wiring substrate 1.

The surfaces of the upper surface metal layer 51 (including the lead wiring portion 52) and the terminal portion 53 are covered with a plating layer. The plating layer is formed by means of electrolytic plating. Electrolytic plating is performed by applying electric power to metal layers such as the upper surface metal layer 51 through the terminal portion 53 and the lead wiring portion 52. After formation of the plating layer on the surfaces of the metal layers in this manner, the lead wiring portion 52 is cut, whereby the terminal portion 53 and the upper surface metal layer 51 are electrically isolated from each other.

Also, an alumina coat (insulating coat layer) 55 is provided on the lead wiring portion 52 such that the alumina coat 55 extends across a portion of the lead wiring portion 52. The alumina coat 55 serves as a mark indicating a cutting location at the time of a process of cutting (laser-cutting) the above-described, wiring, which is performed after completion of the plating. The alumina coat 55 is formed by applying an alumina-containing insulating paste at a predetermined position on the lead wiring portion 52.

Notably, in the present embodiment, the alumina coat is mentioned as one example of the insulating coat layer. However, the material of the insulating coat layer is not limited to alumina and may be any non-conductive material.

In a state in which the semiconductor chip 71 is mounted on the wiring substrate 1, a liquid resin material is poured into the recess 10 of the ceramic substrate 11. As a result of hardening of this resin material, a state in which the recess 10 is filled with the resin is created. As a result, the semiconductor package 70 is obtained. Notably, the semiconductor package 70 may have a structure in which no resin material is poured into the recess 10 of the ceramic substrate 11. Namely, in a different embodiment, the semiconductor package 70 is formed by mounting the semiconductor chip 71 on the wiring substrate 1 and electrically connecting the semiconductor chip 71 and the wiring substrate 1 to each other.

The ceramic substrate 11 has a layered structure in which a plurality of ceramic layers are stacked. In the present embodiment, the ceramic substrate 11 has a structure in which a base ceramic layer 20, a first ceramic layer 21, and a second ceramic layer 22 are stacked in this order from the lower side (see FIG. 4, etc.).

Each ceramic layer can be formed of, for example, a high-temperature fired ceramic material whose main component is alumina ($Al_2O_3$). In a different embodiment, the ceramic sheet may be formed of meddle-temperature fired ceramic (MICC), such as glass-ceramic, or low-temperature fired ceramic (LTCC).

The base ceramic layer 20 has the shape of an approximately quadrangular flat plate. The recess 10 is formed in a central portion of an upper surface of the base ceramic layer 20. A bottom surface of the recess 10 serves as the element mounting portion 10a.

The first ceramic layer 21 has the shape of an approximately quadrangular flat plate whose size is approximately the same as the base ceramic layer 20. The first ceramic layer 21 has an opening at its central portion; i.e., has a frame-like shape. The first ceramic layer 21 is stacked on the base ceramic layer 20 such that the first ceramic layer 21 surrounds an outer circumferential portion of the upper surface of the base ceramic layer 20 when viewed from above.

The second ceramic layer 22 has the shape of an approximately quadrangular flat plate whose size is approximately the same as the base ceramic layer 20 and the first ceramic layer 21. The second ceramic layer 22 has an opening at its central portion; i.e., has a frame-like shape. The opening of the second ceramic layer 22 has an opening area approximately the same as the opening of the first ceramic layer 21. The second ceramic layer 22 is stacked on the first ceramic layer 21 such that the second ceramic layer 22 surrounds an outer circumferential portion of the upper surface of the first ceramic layer 21 when viewed from above.

By virtue of the above-described structure, in the wiring substrate 1, the side wall of the ceramic substrate 11 formed by the first ceramic layer 21 and the second ceramic layer 22 is formed to surround the outer circumference of the recess 10 located at the central portion of the upper surface of the base ceramic layer 20.

Notably, in the present embodiment, each of the first ceramic layer 21 and the second ceramic layer 22 has an opening at its central portion; i.e., has a frame-like shape. However, in a different embodiment, a structure in which none of the first ceramic layer 21 and the second ceramic layer 22 has no opening is possible.

The wiring traces 31, the upper surface metal layer 51, etc. formed on the respective ceramic layers are formed by conductive traces obtained by shaping an electrically conductive material into a predetermined shape. The conductive traces can be formed of a metal material such as copper (Cu), titanium (Ti), tungsten (W), silver (Ag), palladium (Pd), gold (Au), platinum (Pt), molybdenum (Mo), nickel (Ni), or manganese (Mn), or formed of an alloy material which contains any of these metal materials as a main component.

A conventionally known method is used for formation of the conductive traces. Examples of the conventionally known method include a metallization method using printing paste and a method in which a patterned metal layer is transferred. Of these methods, for example, the metallization method is preferably used.

Figure 3:
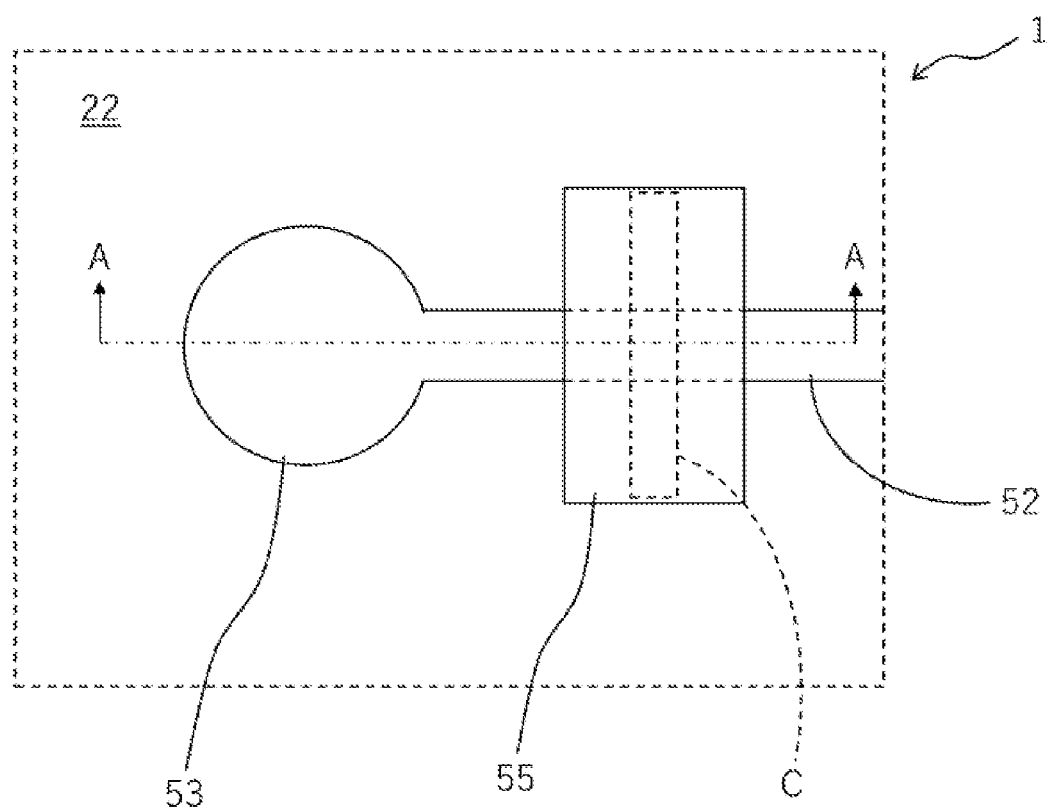
FIG. 3 Plan view showing the configuration of an upper surface of a portion of the wiring substrate shown in FIG. 1.
Figure 4:
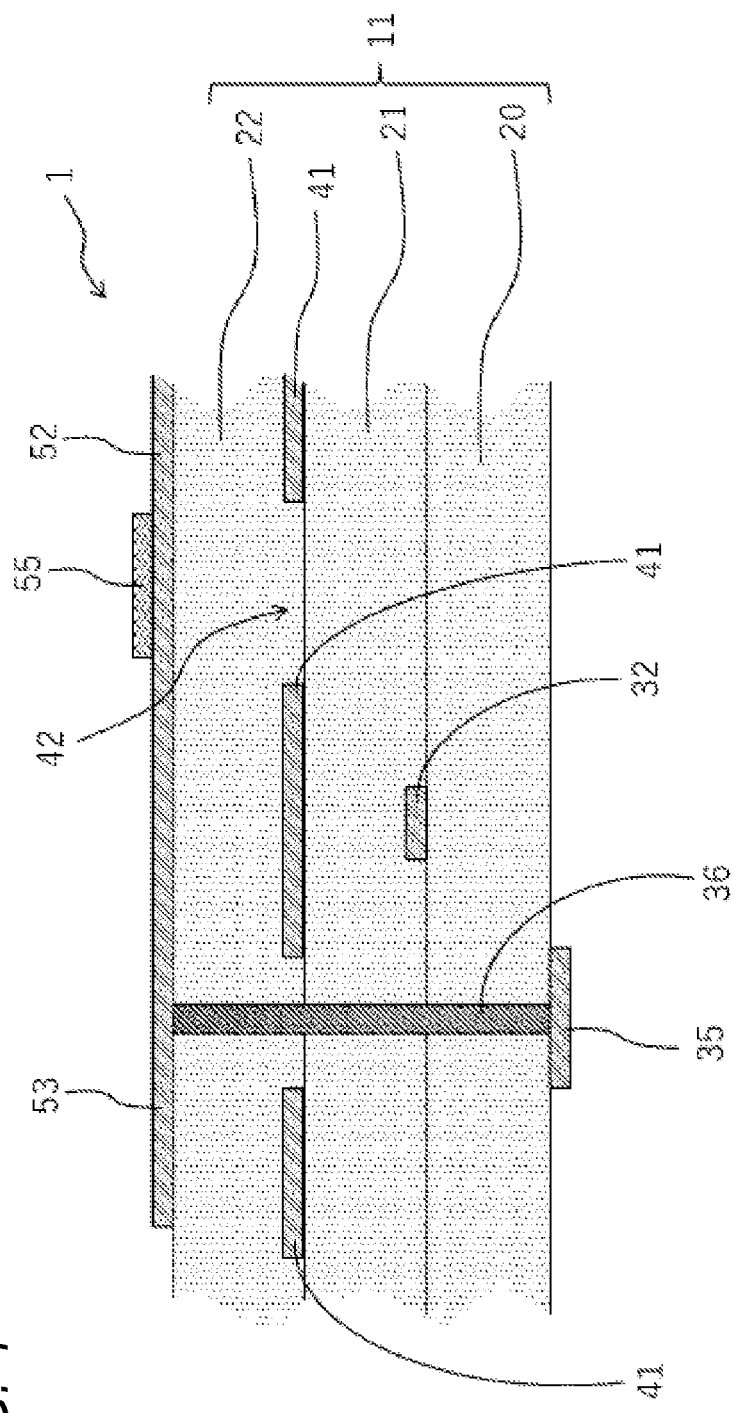
FIG. 4 Sectional view showing the structure of a portion of the wiring substrate shown in FIG. 3 along a line A-A.

Subsequently, the structure of a portion of the wiring substrate 1 around a region where the lead wiring portion 52 and the terminal portion 53 are formed will be described more specifically. FIG. 3 shows the structure of a portion of the wiring substrate 1 around the lead wiring portion 52. FIG. 3 is a plan view which shows, on an enlarged scale, a region within a broken line frame of the wiring substrate 1 shown in FIG. 1. FIG. 4 is a sectional view showing the structure of a portion of the wiring substrate 1 shown in FIG. 3 along a line A-A.

Figure 5:
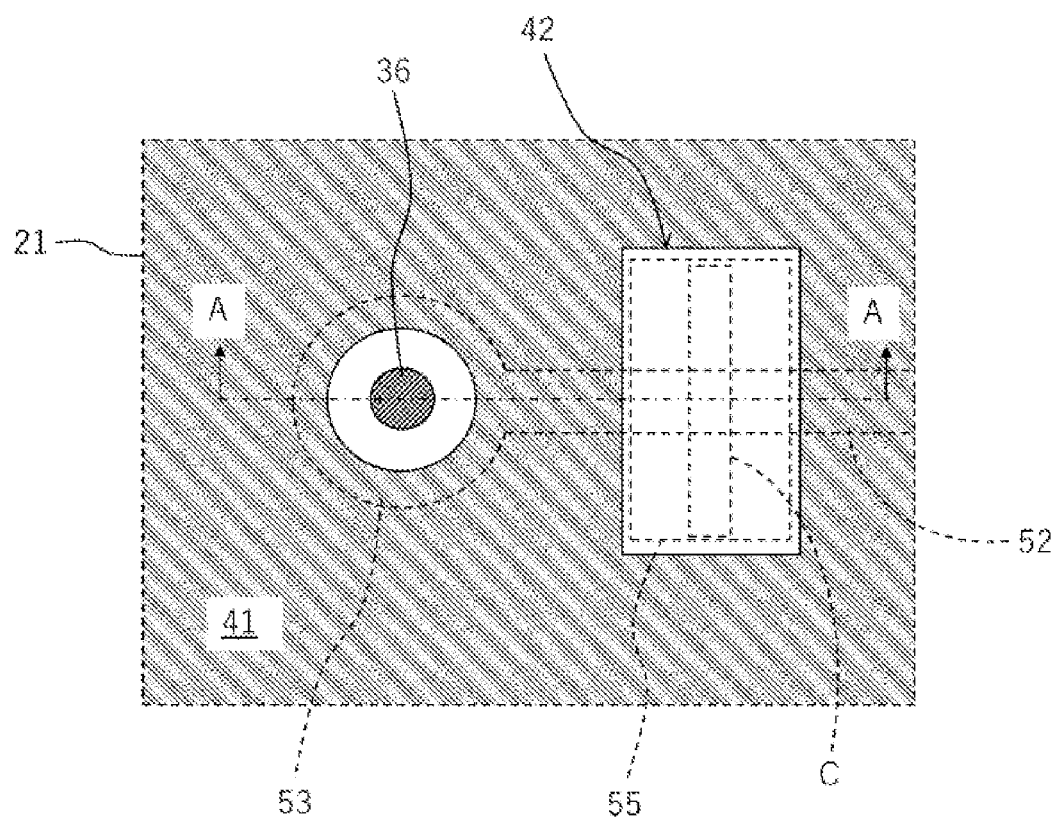
FIG. 5 Plan view showing a solid pattern provided on a ceramic layer in an inner part of the wiring substrate shown in FIG. 3.
Figure 6:
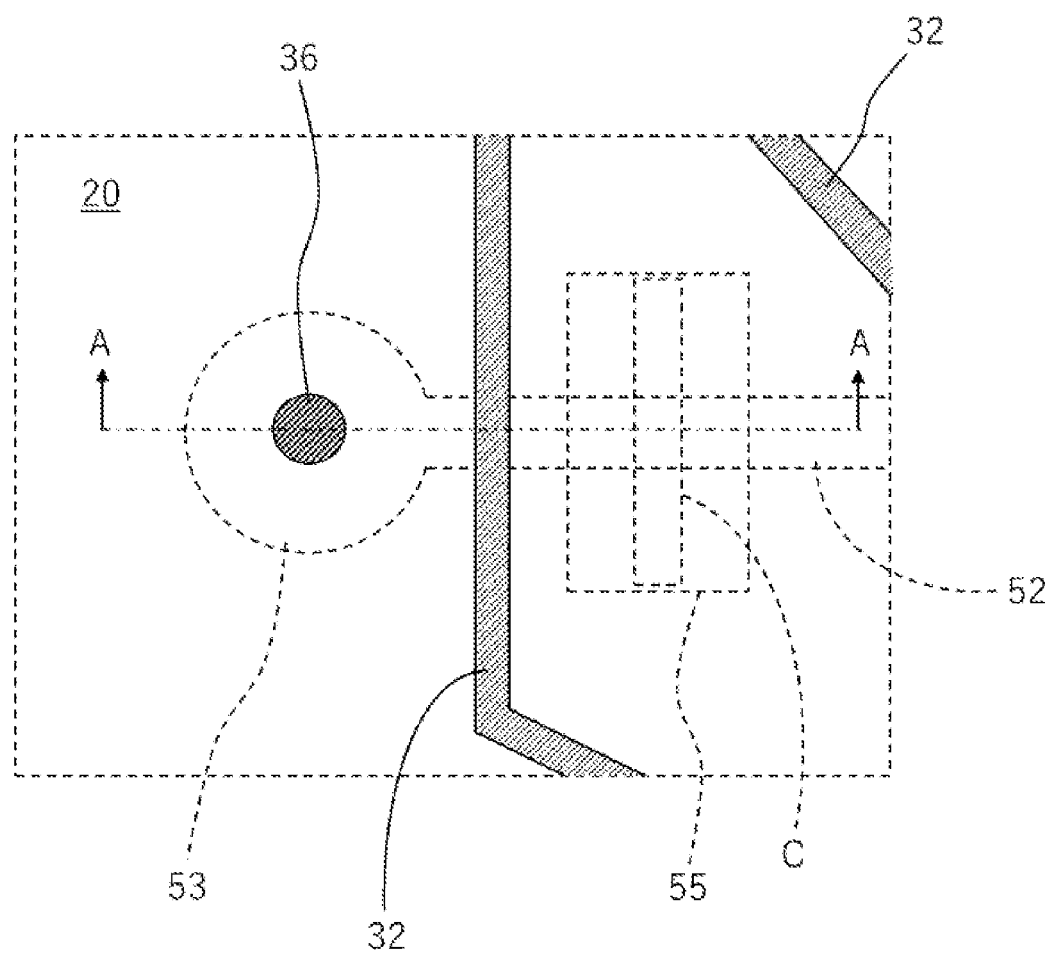
FIG. 6 Plan view showing internal wiring traces provided on a ceramic layer in an inner part of the wiring substrate shown in FIG. 3.

Also, FIG. 5 is a plan view showing the pattern shape of a solid pattern (internal metal layer) 41 provided on the first ceramic layer 21 of the wiring substrate 1 shown in FIG. 3. FIG. 6 is a plan view showing the pattern shapes of internal wiring traces (wiring layer) 32 provided on the base ceramic layer 20 of the wiring substrate 1 shown in FIG. 3.

As shown in FIG. 4, etc., in the present embodiment, the ceramic substrate 11 has a structure in which the base ceramic layer 20, the first ceramic layer 21, and the second ceramic layer 22 are stacked in this order from the lower side.

Metal layers such as the terminal portion 53 and the lead wiring portion 52 are formed on a surface of the second ceramic layer 22 which forms the upper surface of the ceramic substrate 11. These metal layers are also called surface metal layers. Also, the alumina coat 55 is disposed on the lead wiring portion 52 so as to cover a portion of the lead wiring portion 52. In the present embodiment, the alumina coat 55 is disposed to intersect with the extension direction of the lead wiring portion 52; namely, to extend across the lead wiring portion 52.

A lower surface metal layer 35 is formed on a surface of the base ceramic layer 20, which forms the lower surface of the ceramic substrate 11. Like the wiring traces 31 and the upper surface metal layer 51, the lower surface metal layer 35 is formed of a conductor trace Obtained by shaping an electrically conductive material into a predetermined shape. As shown in FIG. 4, etc., the lower surface metal layer 35 is electrically connected to the terminal portion 53 provided on the upper surface of the ceramic substrate 11 through a via 36 provided to penetrate the ceramic substrate 11.

Also, conductor traces, such as the internal wiring traces 32 and the solid pattern 41, are provided in an inner part of the ceramic substrate 11. Like the wiring traces 31, the upper surface metal layer 51, etc., each of the internal wiring traces 32 and the solid pattern 41 is formed of a conductor trace obtained by shaping an electrically conductive material into a predetermined shape.

In the present embodiment, the solid pattern 41 is provided on the first ceramic layer 21. The solid pattern 41 is provided to cover the greater part of the surface of the first ceramic layer 21. The solid pattern 41 is connected to, for example, the ground (GND). This can reduce the influence of noise on electric signals transmitted through wiring traces provided in the wiring substrate 1. Notably, it is preferred that, in order to enhance the noise reduction effect, the area in which the solid pattern 41 is disposed be expanded to an extent possible.

In view of the above, in the wiring substrate 1 according to the present embodiment, the solid pattern 41 is formed over the entire surface of the first ceramic layer 21, excluding a pattern removed region (opening) 42, a region where the via 36 is disposed, and a region therearound.

The pattern removed region 42 is formed by providing an opening in a portion of the conductor trace which forms the solid pattern 41. The pattern removed region 42 is provided in a region which overlaps with the region where the alumina coat 55 is formed, as viewed from above, such that the pattern removed region 42 contains the entire region where the alumina coat 55 is formed (see FIG. 5). In the example shown in FIG. 5, the pattern removed region (opening) 42 has an approximately quadrangular shape. However, the shape of the pattern removed region (opening) 42 is not limited to the approximately quadrangular shape. Also, in the case where the pattern removed region 42 is provided in an end portion of the solid pattern 41, the pattern removed region 42 may be formed by removing a portion of the end portion of the solid pattern 41.

Since the pattern removed region 42 as described above is provided in the solid pattern 41, it is possible to avoid the possibility that, when the lead wiring portion 52 is cut by using, for example, a laser beam, the laser beam reaches the position of the solid pattern 41 and forms a groove in the solid pattern 41. As a result, even in the case where a groove 61 is formed in the first ceramic layer 21, exposure of a portion of the solid pattern 41 to the surface can be avoided, whereby the possibility that the solid pattern 41 is shorted can be reduced.

Also, in the present embodiment, the internal wiring traces 32 are provided on the base ceramic layer 20. The internal wiring traces 32 are routed between the base ceramic layer 20 and the first ceramic layer 21 to have respective arbitrary pattern shapes. Some internal wiring traces 32 are connected to the wiring traces 31 exposed to the upper surface of the wiring substrate 1.

The internal wiring traces 32 are disposed in such a manner that, as viewed from above, the internal wiring traces 32 detour around the region where the alumina coat 55 is formed so as not to overlap with the region where the alumina coat 55 is formed (see FIG. 6). As a result, it is possible to avoid the possibility that, when the lead wiring portion 52 is cut by using, for example, a laser beam, the laser beam reaches the position of the internal wiring traces 32, whereby the internal wiring traces 32 are cut by the laser beam.

Figure 7:
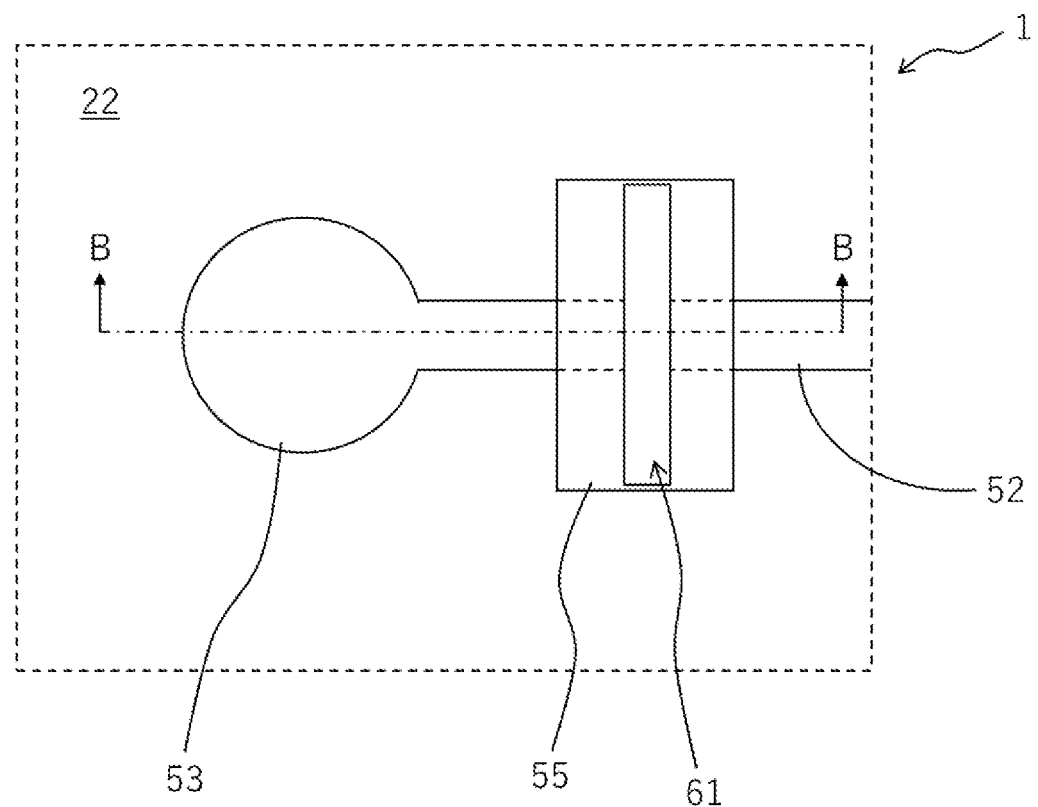
FIG. 7 Plan view showing a state in which a groove is formed in an alumina coat forming region of the wiring substrate shown in FIG. 3.
Figure 8:
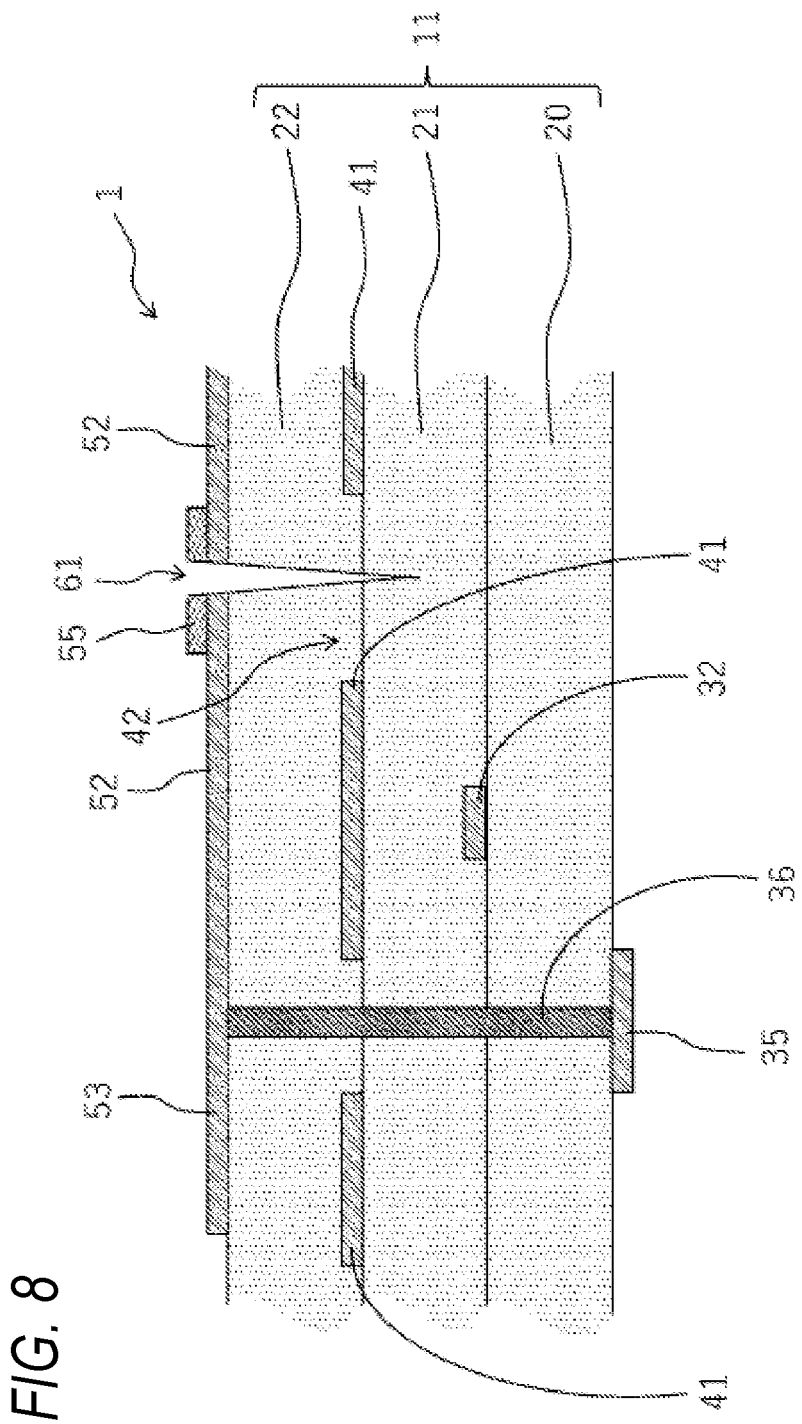
FIG. 8 Sectional view showing the structure of a portion of the wiring substrate shown in FIG. 7 along a line B-B.

Subsequently, the wiring substrate 1 with the groove 61 formed in the lead wiring portion 52 will be described, FIG. 7 shows a state in which the groove 61 is formed in a region of the upper surface of the wiring substrate 1 where the alumina coat 55 is formed. FIG. 7 corresponds to an enlarged view of a region of the semiconductor package 70 within a broken-line frame shown in FIG. 2. FIG. 8 is a sectional view showing the structure of a portion of the wiring substrate 1 shown in FIG. 7 along a line B-B.

The groove 61 is provided to extend across the lead wiring portion 52, Such a groove 61 can be formed, after manufacture of the wiring substrate 1 shown in FIG. 1, by performing a groove forming step in which a light beam (for example, laser beam, ion beam, electron beam, or the like) or a cutting tool (for example, Leutor or the like) is used. The groove forming step is performed after plating layers have been formed, by means of electrolytic plating, on the metal layers formed on the substrate surface, etc. after firing of the wiring substrate 1. As a result of formation of the groove 61 which divides the lead wiring portion 52 as described above, the electrical connection between the terminal portion 53 and the upper surface metal layer 51 can be cut off.

The groove forming step is preferably performed by using a laser beam. This makes it possible to form a groove while more precisely designating an intended position and to form a finer groove. The laser beam used in the present embodiment is, for example, an ordinary laser beam used in laser machining, such as $CO_2$ laser, fiber laser, and YAG laser. Also, ordinary conditions employed for cutting wiring traces formed on a substrate can be applied to the conditions of laser machining.

In FIG. 3, a broken-line frame shows a region C to which a laser beam is applied in the groove forming step. As described above, the alumina coat 55, which can serve as a mark indicating a cutting location is provided in a to-be-cut region on the lead wiring portion 52. The region C to which the laser beam is applied is located within the region where the alumina coat 55 is formed. At the time of the groove forming step, the laser beam is applied to the region where the alumina coat 55 is formed.

When the laser beam is applied to the region C, the groove 61 is formed. As shown in FIG. 8, etc., the groove 61 is formed to reach an inner part of the ceramic substrate 11. Although the depth of the formed groove 61 changes with various conditions, such as the intensity of the laser beam, the formed groove 61 may have a depth of, for example, up to about 0.5 mm as measured from the substrate surface.

Meanwhile, the thickness of each of the ceramic layers such as the first ceramic layer 21 and the second ceramic layer 22 falls within the range of, for example, 0.1 mm to 0.3 mm. Therefore, when a laser beam is applied form the upper surface side of the wiring substrate 1, the laser beam may reach an inner part of the first ceramic layer 21. As a result, as shown in FIG. 8, the groove 61 may be formed through the second ceramic layer 22 and formed in a portion of the first ceramic layer 21.

In the wiring substrate 1 according to the present embodiment, the pattern removed region 42 is provided in the solid pattern 41 provided between the first ceramic layer 21 and the second ceramic layer 22. As described above, the pattern removed region 42 is provided in a region which overlaps with the region where the alumina coat 55 is formed, as viewed from above, such that the pattern removed region 42 contains the entire region where the alumina coat 55 is formed (see FIG. 5). Furthermore, the region C to which the laser beam is applied is located within the region where the alumina coat 55 is formed.

Therefore, the groove 61 formed as a result of application of the laser beam is located in the region where the pattern removed region 42 is formed as viewed from above. Namely, the solid pattern 41 has the pattern removed region 42 formed in a region which overlaps with the region where the groove 61 is formed, as viewed from above, in such a manner that the pattern removed region 42 contains the entirety of the region where the groove 61 is formed.

This configuration enables avoidance of the possibility that, at the time of the groove forming step, the laser beam reaches the position of the solid pattern 41 and a groove is formed in the solid pattern 41. As a result, even in the case where the groove 61 is formed in the first ceramic layer 21, exposure of a portion of the solid pattern 41 to the surface can be avoided, whereby the possibility that the solid pattern 41 is shorted can be reduced.

Also, in the wiring substrate 1 of the present embodiment, the internal wiring traces 32 are provided between the base ceramic layer 20 and the first ceramic layer 21. As described above, the internal wiring traces 32 are disposed in such a manner that, as viewed from above, the internal wiring traces 32 detour around the region where the alumina coat 55 is formed, so as not to overlap with the region where the alumina coat 55 is formed (see FIG. 6). Furthermore, the region C to which the laser beam is applied is located within the region where the alumina coat 55 is formed.

Therefore, the groove 61 formed as a result of application of the laser beam is formed in a region which does not overlap with the positions of the internal wiring traces 32 as viewed from above. Namely, the internal wiring traces 32 are disposed in such a manner that, as viewed from above, the internal wiring traces 32 detour around the region where the groove 61 is formed, so as not to overlap with the region where the groove 61 is formed.

By virtue of this configuration, even when the laser beam reaches the first ceramic layer 21, on which the internal wiring traces 32 are formed, in the groove forming step, it is possible to avoidance the possibility that the internal wiring traces 32 are cut by the laser beam.

As described above, the groove 61 formed in the groove forming step has a depth of, for example, up to about 0.5 mm as measured from the substrate surface. Therefore, the present embodiment is preferably applied to a structure in which the internal wiring traces 32 are provided at a position located 0.5 mm or less from the surface of the ceramic substrate 11. Similarly, the present embodiment is preferably applied to a structure in which the solid pattern 41 is provided at a position located 0.5 mm or less from the surface of the ceramic substrate 11.

Also, the structure of the present embodiment is more preferably applied to a structure in which the internal wiring traces 32 and the solid pattern 41 are provided at respective positions located 0.3 mm or less from the surface of the ceramic substrate 11. The thickness of each ceramic layer falls within the range of 0.1 mm to 0.3 mm. Accordingly, as to a wiring layer formed on a ceramic layer which is located away from the substrate surface by a distance corresponding to three or more layers, the wiring layer is not required to detour around the region where the alumina coat 55 and the groove 61 are formed. Also, as to an internal metal layer formed on a ceramic layer which is located away from the substrate surface by a distance corresponding to three or more layers, the internal metal layer is not required to have an opening in a region which overlaps with the region where the alumina coat 55 and the groove 61 are formed, as viewed from above.

Modification 1

Figure 9:
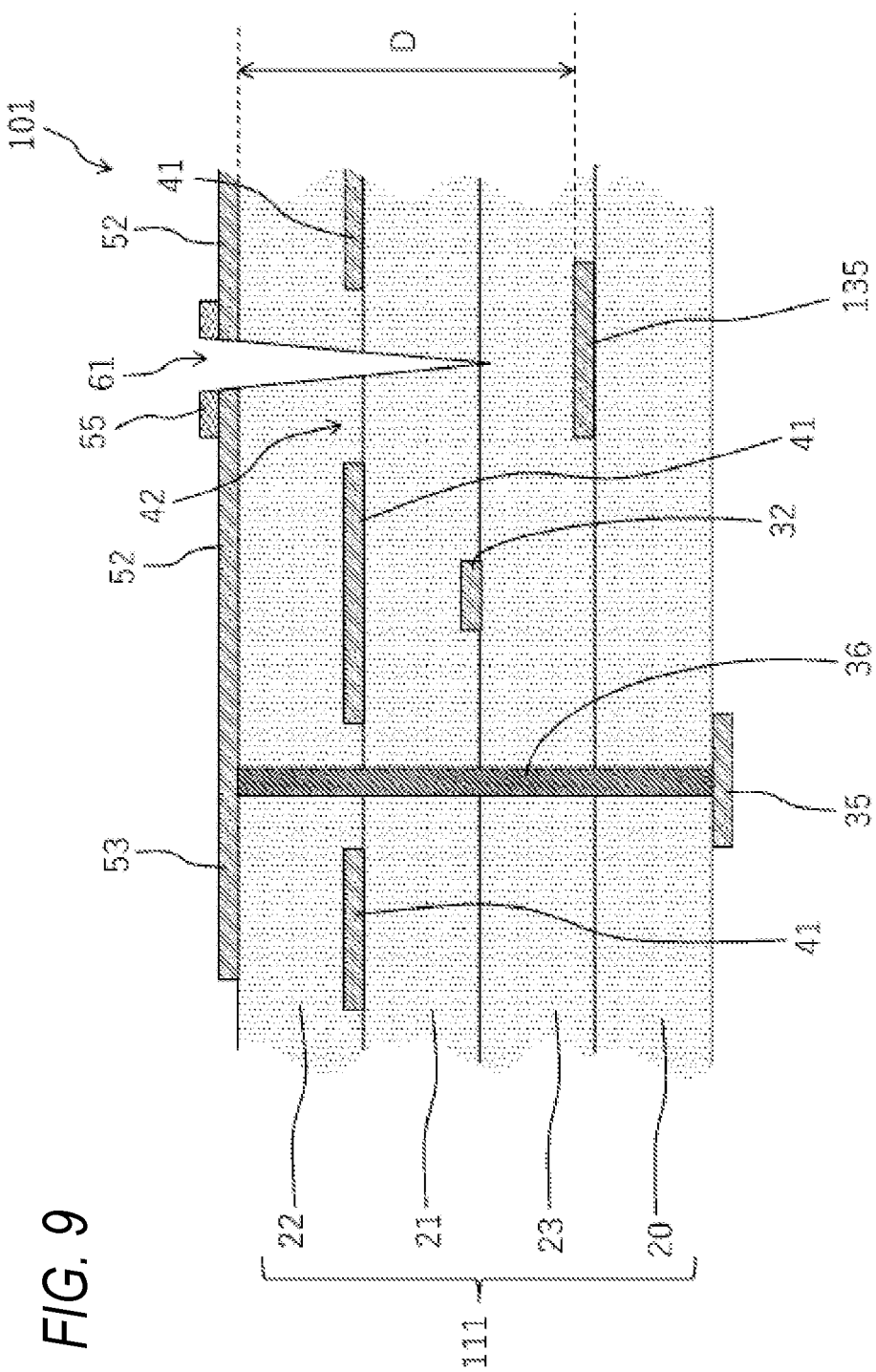
FIG. 9 Sectional view showing the structure of a wiring substrate according to a modification.

FIG. 9 shows the sectional structure of a portion of a wiring substrate 101 according to one modification of the present embodiment. The wiring substrate 101 includes a ceramic substrate 111. The ceramic substrate 111 has a structure in which a base ceramic layer 20, a third ceramic layer 23, a first ceramic layer 21, and a second ceramic layer 22 are stacked in this order from the lower side. The wiring substrate 101 differs from the wiring substrate 1 in the point that the third ceramic layer 23 is further provided between the base ceramic layer and the first ceramic layer 21.

Conductor traces, such as the internal wiring traces 32 and the solid pattern 41, are provided in an inner part of the ceramic substrate 111. As to the configurations of the internal wiring traces 32 and the solid pattern 41, configurations similar to those employed in the wiring substrate 1 can be applied.

In the wiring substrate 101 according to the modification, a metal layer 135 is further provided between the base ceramic layer 20 and the third ceramic layer 23. The metal layer 135 may function as a solid pattern or an internal wiring. The distance D from the surface of the ceramic substrate 111 to the position of the metal layer 135 is greater than 0.5 mm. As viewed from above, the metal layer 135 is provided at a position which overlaps with the region where the groove 61 is formed or the region where the alumina coat 55 is formed.

As described above, at a position where the distance D between that position and the surface of the ceramic substrate 111 in the thickness direction is greater than 0.5 mm, an internal metal layer or a wiring layer such as the metal layer 135 may be provided, because the possibility that a laser beam reaches such a position in the groove forming step is low.

Notably, it is more preferred that, as in the wiring substrate 1 of the first embodiment, on all the ceramic layers of the ceramic substrate 11, the internal wiring traces 32 be disposed in such a manner that, as viewed from above, they detour around the region where the alumina coat 55 or the groove 61 is formed so as not to overlap with the region where the alumina coat 55 or the groove 61 is formed. Similarly, it is preferred that, on all the ceramic layers of the ceramic substrate 11, the solid pattern 41 have a pattern removed region 42 in a region which overlaps with the region where the alumina coat 55 or the groove 61 is formed, as viewed from above. By virtue these configurations, it is possible to omit electrical inspection of wirings performed after manufacture of the wiring substrate 1.

Other Modifications

In different modifications, the alumina coat 55 may be omitted. Namely, in a wiring substrate according to one modification, the groove 61 is provided to extend across the lead wiring portion 52 provided on the surface of the ceramic substrate 11. However, the alumina coat 55 is not provided around the groove 61. The internal wiring traces 32 disposed in an inner part of the ceramic substrate 11 are disposed in such a manner that, as viewed from above, they detour around the region where the groove 61 is formed so as not to overlap with the region where the groove 61 is formed.

Also, the terminal portion 53 provided at the distal end of the lead wiring portion 52 is not limited to the connection terminal to which electric power is applied at the time of electrolytic plating. In one modification, the terminal portion 53 may be a particular mounting pad, for example, a pad for mounting a capacitor. Namely, the process of cutting the lead wiring portion 52 may be performed so as to isolate the particular mounting pad from other mounting pads.

Summary of First Embodiment

As described above, the wiring substrate 1 according to the present embodiment includes the ceramic substrate (insulating substrate) 11, a surface metal layer provided on the surface of the ceramic substrate 11, a wiring layer disposed in an inner part of the ceramic substrate 11, and the groove 61 provided to extend across the surface metal layer. The surface metal layer (for example, the lead wiring portion 52)

is divided by the groove 61. The wiring layer (for example, the internal wiring traces 32) is disposed in such a manner that, as viewed from above, the wiring layer detours around the region where the groove 61 is formed so as not to overlap with the region where the groove 61 is formed.

By virtue of the above-described configuration, it is possible to reduce the possibility that the wiring layer, etc. formed in an inner part of the ceramic substrate 11 are cut in the groove forming step performed for forming the groove 61 in the lead wiring portion 52.

Still Other Modifications

Notably, the wiring substrate 1 is not required to have the groove 61, for example, in the case where the wiring substrate 1 is shipped as an individual substrate.

Namely, a wiring substrate 1 according to another different modification includes the ceramic substrate (insulating substrate) 11, a surface metal layer provided on the surface of the ceramic substrate 11, a wiring layer disposed in an inner part of the ceramic substrate 11, and an insulating coat layer (for example, the alumina coat 55) disposed to cover a portion of the surface metal layer (for example, the lead wiring portion 52). The wiring layer (for example, the internal wiring traces 32) is disposed in such a manner that, as viewed from above, the wiring layer detours around the region where the insulating coat layer is formed so as not to overlap with the region where the insulating coat layer is formed.

By virtue of the above-described configuration, it is possible to reduce the possibility that the wiring layer, etc. formed in an inner part of the ceramic substrate 11 are cut when a laser beam or the like is applied to the alumina coat 55 on the lead wiring portion 52, thereby cutting the lead wiring portion 52.

As described above, the wiring substrate according to the different modification includes an insulating substrate, a surface metal layer provided on the surface of the insulating substrate, a wiring layer disposed in an inner part of the insulating substrate, and an insulating coat layer disposed to cover a portion of the surface metal layer. In this wiring substrate, the wiring layer is disposed in such a manner that, as viewed from above, the wiring layer detours around the region where the insulating coat layer is formed so as not to overlap with the region where the insulating coat layer is formed.

By virtue of the above-described configuration, it is possible to avoid the possibility that, when the surface metal layer is divided by using a laser beam or the like, the laser beam reaches an internal position where the wiring layer is formed, whereby the wiring layer is cut by the laser beam.

In the above-described wiring substrate according to the different modification, an internal metal layer may be further provided in an inner part of the insulating substrate, and the internal metal layer may have an opening provided in a region overlapping with the region where the insulating coat layer is formed, as viewed from above, in such a manner that the opening contains the entire region where the insulating coat layer is formed.

By virtue of the above-described configuration, it is possible to avoid the possibility that, when the surface metal layer is divided by using a laser beam or the like, the laser beam reaches a position where the internal metal layer is formed, whereby a groove is formed in the internal metal layer. As a result, it is possible to prevent exposure of a portion of the internal metal layer to the surface, thereby reducing the possibility that the internal metal layer is shorted.

Second Embodiment

Figure 10:
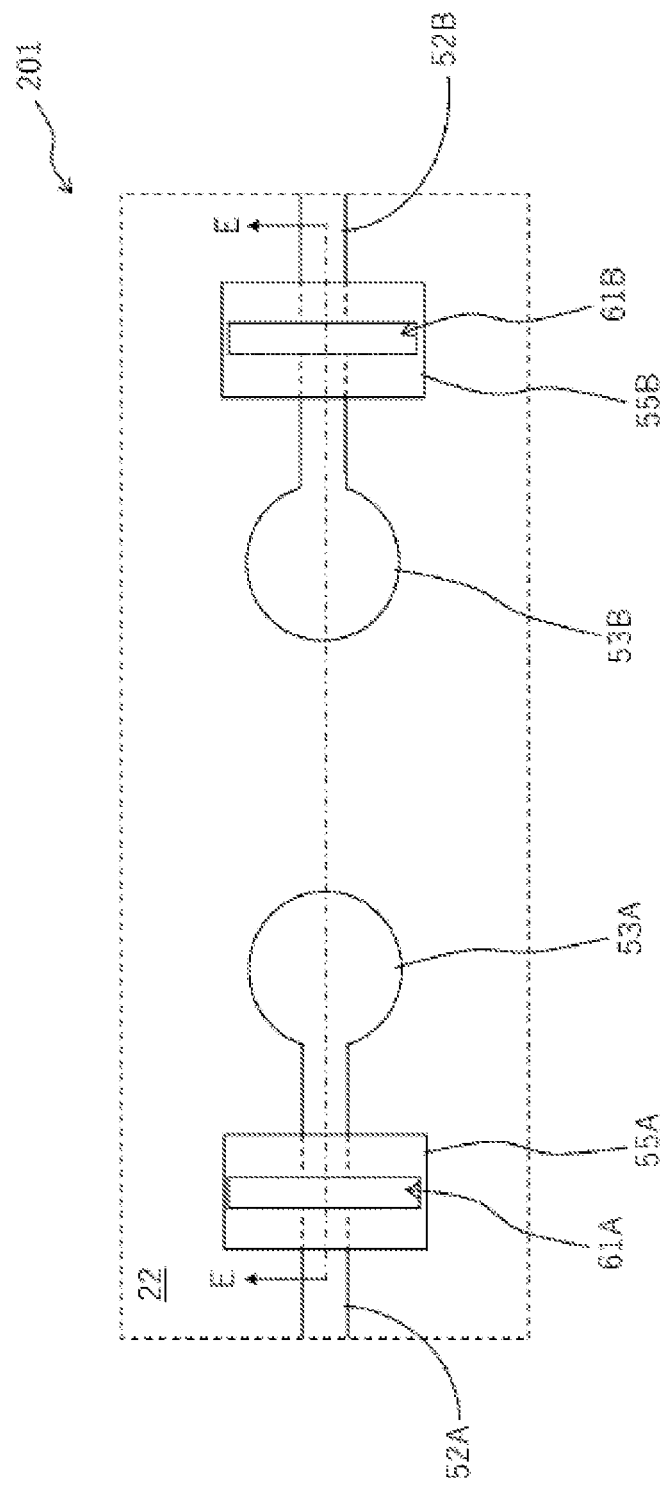
FIG. 10 Plan view showing the configuration of an upper surface of a portion of a wiring substrate according to a second embodiment.

Subsequently, a wiring substrate 1 according to a second embodiment will be described with reference to FIGS. 10 to 12. FIG. 10 shows, on an enlarged scale, an upper surface of a portion of the wiring substrate 201 according to the second embodiment. FIG. 10 shows the structure of a portion of the wiring substrate 201 around lead wiring portions 52.

In the wiring substrate 201 according to the second embodiment, two lead wiring portions 52, which branch off the upper surface metal layer 51 at predetermined positions are provided on the upper surface of the ceramic substrate 11. In FIG. 12, of the two lead wiring portions 52, the lead wiring portion 52 located on the left side is referred to as the lead wiring portion 52A, and the lead wiring portion 52 located on the right side is referred to as the lead wiring portion 52B. A terminal portion 53 is provided at the distal end of each lead wiring portion 52. In FIG. 12, of the two terminal portions 53, the terminal portion located on the left side is referred to as the terminal portion 53A, and the terminal portion located on the right side is referred to as the terminal portion 53B.

An alumina coat (insulating coat layer) 55A is provided on the lead wiring portion 52A in such a manner that the alumina coat 55A extends across a portion of the lead wiring portion 52A. An alumina coat (insulating coat layer) 55B is provided on the lead wiring portion 52B in such a manner that the alumina coat 55B extends across a portion of the lead wiring portion 52B. The alumina coats 55A and 55B serve as marks indicating cutting locations at the time of a process of cutting (laser-cutting) the above-described wiring, which is performed after completion of plating.

A groove 61A is provided in the region where the lead wiring portion 52A is formed. Also, a groove 61B is provided in the region where the lead wiring portion 52B is formed. The grooves 61A and 61B are provided in such a manner that they extend across the lead wiring portions 52A and 52B, respectively.

Figure 11:
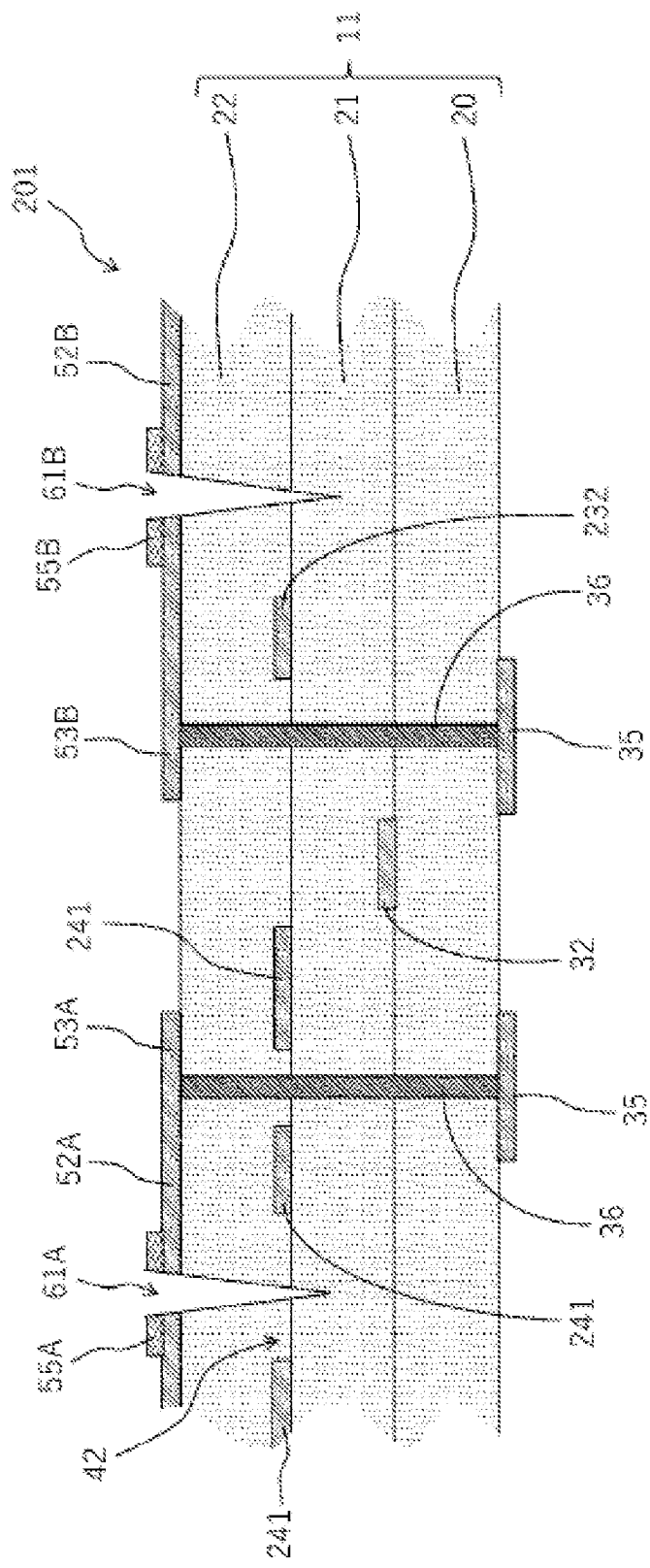
FIG. 11 Sectional view showing the structure of a portion of the wiring substrate shown in FIG. 10 along a line E-E.
Figure 12:
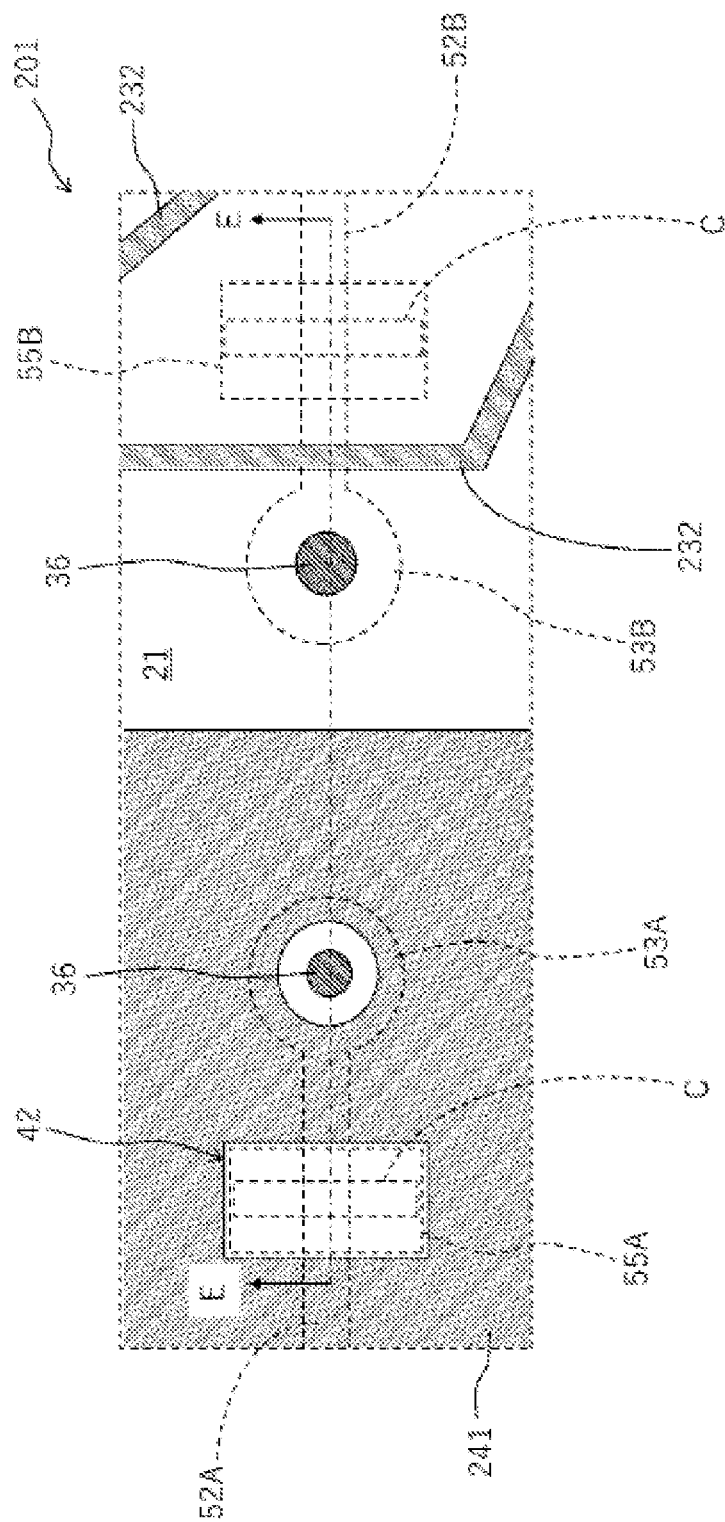
FIG. 12 Plan view showing a solid pattern and internal wiring traces provided on a ceramic layer in an inner part of the wiring substrate shown in FIG. 10.

FIG. 11 is a sectional view showing the structure of a portion of the wiring substrate 1 shown in FIG. 10 along a line E-E. FIG. 12 is a plan view showing the pattern shapes of a solid pattern (internal metal layer) 241 and internal wiring traces (wiring layer) 232 provided on the first ceramic layer 21 of the wiring substrate 201 shown in FIG. 10.

Conductor traces, such as the internal wiring traces 232, the solid pattern 241, and the internal wiring traces 32, are provided in an inner part of the ceramic substrate 11. Specifically, the internal wiring traces 232 and the solid pattern 241 are provided on the first ceramic layer 21, and the internal wiring traces 32 are provided on the base ceramic layer 20.

The solid pattern 241 is provided to cover a partial region of the surface of the first ceramic layer 21. In the example shown in FIG. 12, the solid pattern 241 is provided in a region which overlaps with the region where the lead wiring portion 52A, the terminal portion 53A, etc. are formed, as viewed from above.

The solid pattern 241 has a pattern removed region 42. The pattern removed region 42 is formed by providing an opening in a portion of the conductor trace which forms the solid pattern 41. The pattern removed region 42 is provided in a region which overlaps with the region where the alumina coat 55A provided on the lead wiring portion 52A is formed, as viewed from above, in such a manner that the pattern removed region 42 contains the entire region where the alumina coat 55 is formed (see FIG. 12). A region C to which a laser beam is applied at the time of the groove forming step is located within the region where the alumina coat 55A is formed.

This configuration enables avoidance of the possibility that, at the time of the groove forming step, the laser beam reaches the position of the solid pattern 41 and a groove is formed in the solid pattern 41. As a result, even in the case where the groove 61A is formed in the first ceramic layer 21, exposure of a portion of the solid pattern 241 to the surface can be avoided, whereby the possibility that the solid pattern 241 is shorted can be reduced.

Also, in the present embodiment, not only the solid pattern 241 but also the internal wiring traces 232 are provided on the first ceramic layer 21. The internal wiring traces 232 are disposed in such a manner that, as viewed from above, the internal wiring traces 232 detour around the region where the alumina coat 55B is formed so as not to overlap with the region where the alumina coat 55B is formed (see FIG. 12), Another region C to which a laser beam is applied at the time of the groove forming step is located within the region where the alumina coat 55B is formed.

By virtue of this configuration, the groove 61B formed as a result of application of the laser beam is formed in a region which does not overlap with the positions of the internal wiring traces 232 as viewed from above. Accordingly, it is possible to avoid the possibility that, when the lead wiring portion 52B is cut by using a laser beam or the like, the laser beam reaches the position of the internal wiring traces 232, whereby the internal wiring traces 232 are cut by the laser beam.

Notably, as in the first embodiment, the wiring substrate 201 has the the internal wiring traces 32 provided between the base ceramic layer 20 and the first ceramic layer 21. The internal wiring traces 32 are disposed in such a manner that, as viewed from above, the internal wiring traces 32 detour around the regions where the alumina coats 55A and 55B are formed so as not to overlap with the regions where the alumina coats 55A and 55B are formed. As a result, it is possible to avoid the possibility that, when the lead wiring portions 52A and 52B are cut by using a laser beam or the like, the laser beam reaches the position of the internal wiring traces 32, whereby the internal wiring traces 32 are cut by the laser beam.

It should be considered that the embodiments disclosed this time are illustrative and are not restrictive in all aspects. It is intended that the scope of the present invention is shown by the claims rather than the above-described explanation and that the present invention encompasses all modifications within the meaning and scope equivalent to the claims. Also, the present invention encompasses configurations obtained by mutually combining the configurations of different embodiments described in the present specification.

REFERENCE SIGNS LIST

1: wiring substrate
11: ceramic substrate (insulating substrate)
20: base ceramic layer
21: first ceramic layer
22: second ceramic layer
32: internal wiring trace (wiring layer)
41: solid pattern (internal metal layer)
42: pattern removed region (opening)
52: lead wiring portion (surface metal layer)
53: terminal portion
55: alumina coat (insulating coat layer)
61: groove
70: semiconductor package
71: semiconductor element
101: wiring substrate
111: ceramic substrate
201: wiring substrate
232: internal wiring trace (wiring layer)
241: solid pattern (internal metal layer)

What is claimed is:

1. A wiring substrate comprising:
an insulating substrate;
a surface metal layer provided on a surface of the insulating substrate and divided by a groove formed on the insulating substrate; and
a wiring layer disposed in an inner part of the insulating substrate,
wherein an insulating coat layer is provided around the groove,
wherein the wiring layer is disposed in such a manner that, as viewed from above, the wiring layer detours around a region where the groove is formed and a region where the insulating coat layer is formed so as not to overlap with the region where the groove is formed and the region where the insulating coat layer is formed, and
wherein an internal metal layer is further provided in an inner part of the insulating substrate, and the internal metal layer has an opening formed in a region which overlaps with the region where the groove is formed as viewed from above in such a manner that the opening contains the entirety of the region where the groove is formed.

2. The wiring substrate according to claim 1,
wherein the internal metal layer is provided at a position located 0.5 mm or less from the surface of the insulating substrate.

3. A wiring substrate comprising:
an insulating substrate;
a surface metal layer provided on a surface of the insulating substrate and divided by a groove formed on the insulating substrate; and
a wiring layer disposed in an inner part of the insulating substrate,
wherein an insulating coat layer is provided around the groove,
wherein the wiring layer is disposed in such a manner that, as viewed from above, the wiring layer detours around a region where the groove is formed and a region where the insulating coat layer is formed so as not to overlap with the region where the groove is formed and the region where the insulating coat layer is formed, and
wherein the wiring layer is provided at a position located 0.5 mm or less from the surface of the insulating substrate.

* * * * *